(12) United States Patent
Lin

(10) Patent No.: US 6,521,499 B1
(45) Date of Patent: Feb. 18, 2003

(54) METHOD FOR FORMING NON-VOLATILE MEMORY WITH SELF-ALIGNED CONTACT

(75) Inventor: Chun-Jung Lin, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/020,213

(22) Filed: Dec. 18, 2001

(51) Int. Cl.[7] .......................................... H01L 21/8238
(52) U.S. Cl. ...................................... 438/276; 257/316
(58) Field of Search .............................. 438/276, 277, 438/278, 279; 257/316, 390

(56) References Cited

U.S. PATENT DOCUMENTS 5,741,719 A * 4/1998 Kim ............................. 437/43
6,440,803 B1 * 8/2002 Huang et al. ................ 438/276

* cited by examiner

Primary Examiner—David Nelms
Assistant Examiner—Quoc Hwang

(57) ABSTRACT

A method for forming a non-volatile memory is disclosed. The invention uses elevated buried diffusion polysilicon layers (BDPOLY) and spacers to form self-aligned contact so that the process window can be upgraded. The spacers can be used as an etching stop layer so that the misalignment of contact holes will not present any process issues and device failures resulting from the etching of the contact holes.

20 Claims, 5 Drawing Sheets

METHOD FOR FORMING NON-VOLATILE MEMORY WITH SELF-ALIGNED CONTACT

BACKGROUND OF THE INVENTION

1. Field of the Invention

The present invention relates to a method for forming a non-volatile memory, and more particularly to a method for forming a non-volatile memory with a self-aligned contact.

2. Description of the Related Art

Very large scale integration (VLSI) and more recently, the ultra scale integration (ULSI) of integrated circuits require semiconductor contact structures that provide high levels of performance. It is well known that in the progression of integrated circuits, as device dimensions approached the sub-micron regime, the conventional contacts used up to that point began to limit device performance in several ways. It was not possible to minimize the contact resistance when the contact hole was also scaled down for the contact resistance went up inversely with the smaller contact area. In addition, the area of the diffusion regions could not be minimized because the contact hole had to be aligned to these regions with a separate masking step, and extra regions had to be allocated for misalignment. The larger regions also resulted in increased junction capacitance between diffusion region and substrate, which slowed down the device speed. As a result, methods had to be developed to reduce the contact areas commensurate with the large-scale integration technology.

In view of the drawbacks mentioned with the prior art process, there is a continued need to develop new and improved processes that overcome the disadvantages associated with prior art processes. The advantages of this invention are that it solves the problems mentioned above.

SUMMARY OF THE INVENTION

It is therefore an object of the invention to provide a method for forming a non-volatile memory with an upgraded process window.

It is another object of this invention to provide a new non-volatile memory structure that can prevent any process issues and device failures resulting from the etching of the contact holes.

It is a further object of this invention to provide a novel method for forming a reliable non-volatile memory structure.

To achieve these objects, and in accordance with the purpose of the invention, the invention uses elevated buried diffusion polysilicon layers (BDPOLY) and spacers to form contacts so that the process window can be upgraded. The spacers can be used as an etching stop layer so that the misalignment of contact holes will not present any process issues and device failures resulting from the following etching of the contact holes. The invention uses a method comprising the following steps. First of all, a substrate having a first dielectric layer thereon, a first conductive layer on said first dielectric layer and a second dielectric layer on said first conductive layer is provided. Then a pattern of buried diffusion regions is transferred into said second dielectric layer and said first conductive layer to expose said first dielectric layer and form a plurality of conductive lines. Next a third dielectric layer is formed over said substrate. Furthermore, said third dielectric layer is etched back to expose said substrate and said second dielectric layer and form spacers adjacent the side walls of said conductive lines. Moreover, an ion implantation process is performed on said substrate to form the buried diffusion regions in said substrate. Then a second conductive layer is formed over said substrate. Next said second conductive layer is etched back to a level lower than the top of said spacers. Moreover, the top surface of said second conductive layer is oxidized to form an oxide layer. Said second dielectric layer is then removed. Furthermore, a third conductive layer is formed over said substrate. Next a fourth conductive layer is formed over said third conductive layer. Then a fourth dielectric layer is formed over said fourth conductive layer. Next a word line pattern comprising a plurality of word line substantially perpendicular to said conductive lines is transferred into said fourth dielectric layer, said fourth conductive layer and said third conductive layer to expose said oxide layer. Furthermore, a fifth dielectric layer is formed over said substrate. Moreover, a sixth dielectric layer formed over said fifth dielectric layer. Then said sixth dielectric layer is etched back to expose said fifth dielectric layer. Next a seventh dielectric layer is formed over said substrate. Finally, contact holes are formed into said seventh dielectric layer and said oxide layer to expose said conductive lines.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
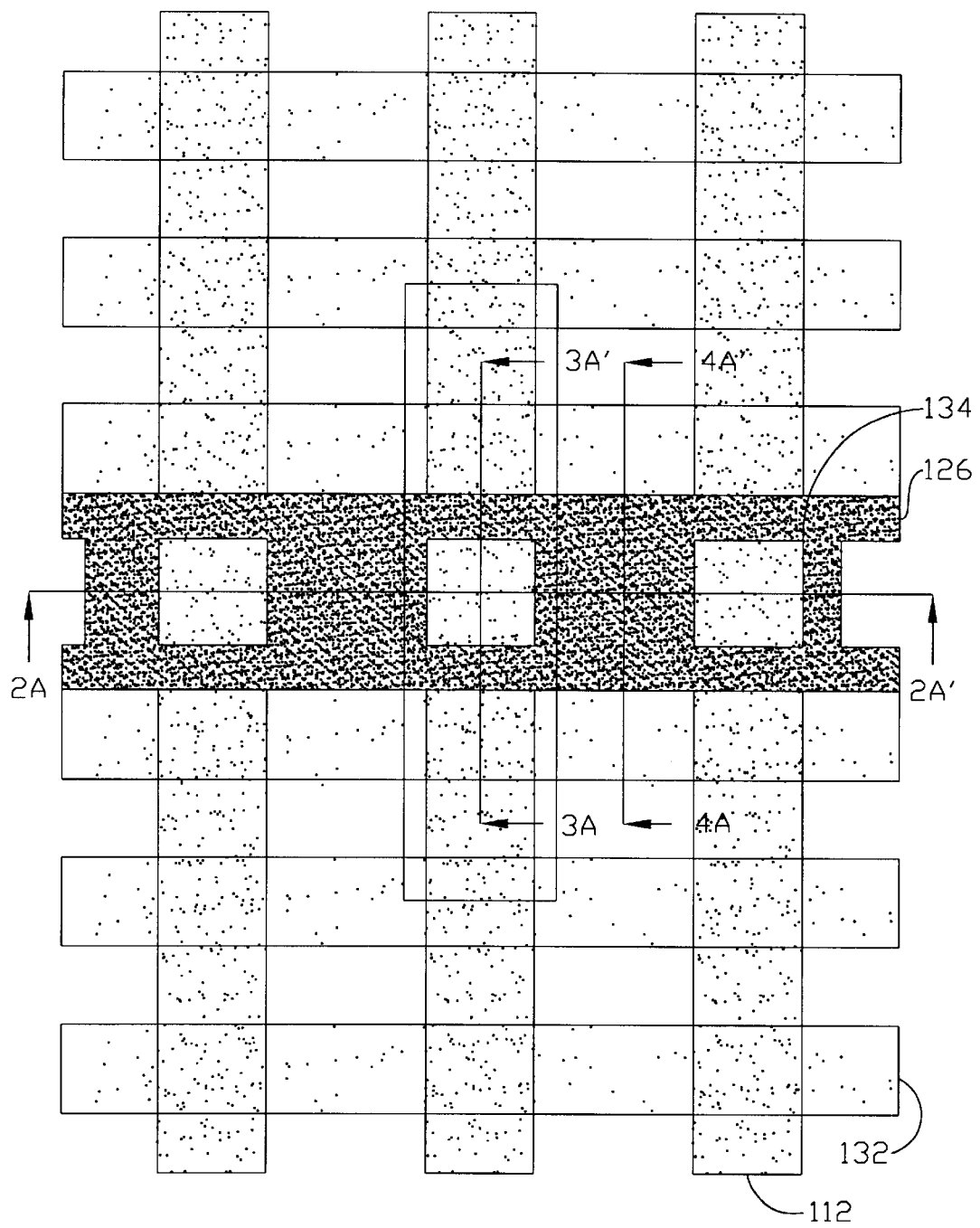
FIG. 1 shows a top view of non-volatile memories of this invention.
Figure 3A:
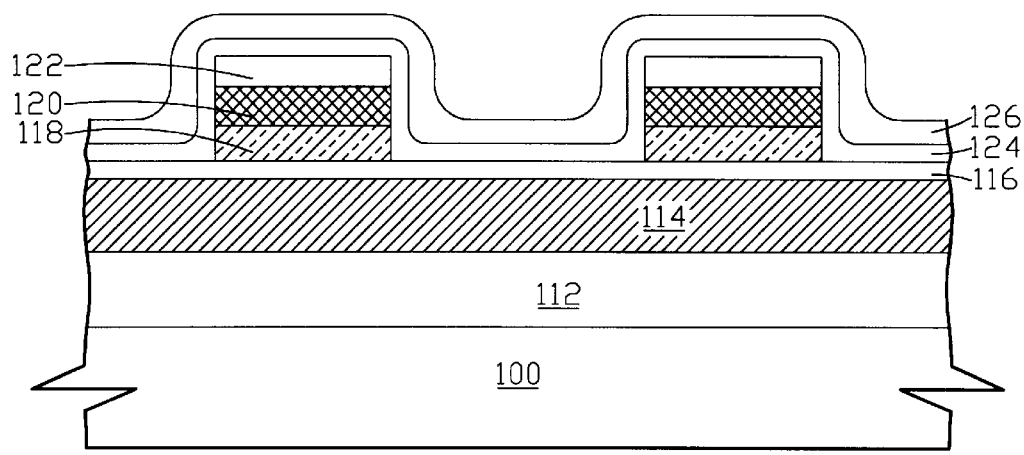
FIG. 3A shows a result of etching the dielectric layer, the conductive layer and the conductive layer to expose the oxide layer and forming word lines shown in FIG. 1.
Figure 3B:
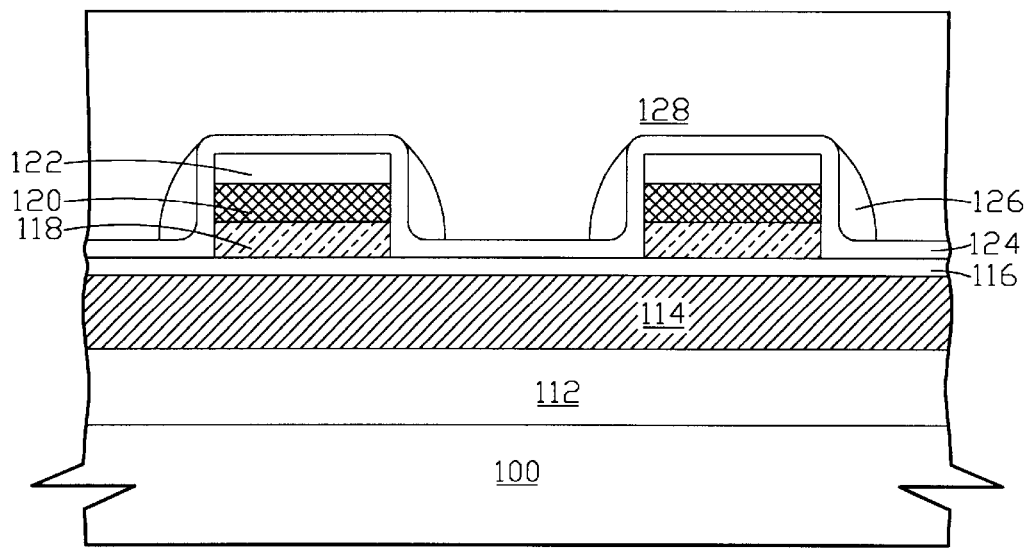
FIG. 3B shows a result of etching back the dielectric layer to form spacers adjacent the side walls of the word lines and forming an ILD layer over the structure shown in FIG. 3B.
Figure 3C:
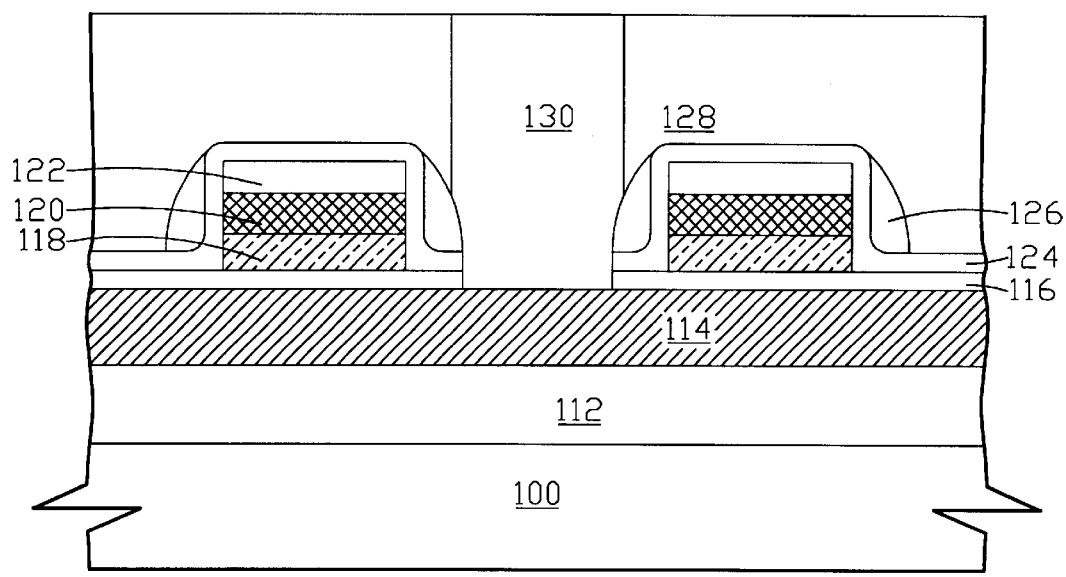
FIG. 3C shows a result of forming a contact hole into the ILD layer to expose the conductive layer and filling a conductive material into the contact hole to form a contact.
Figure 4:
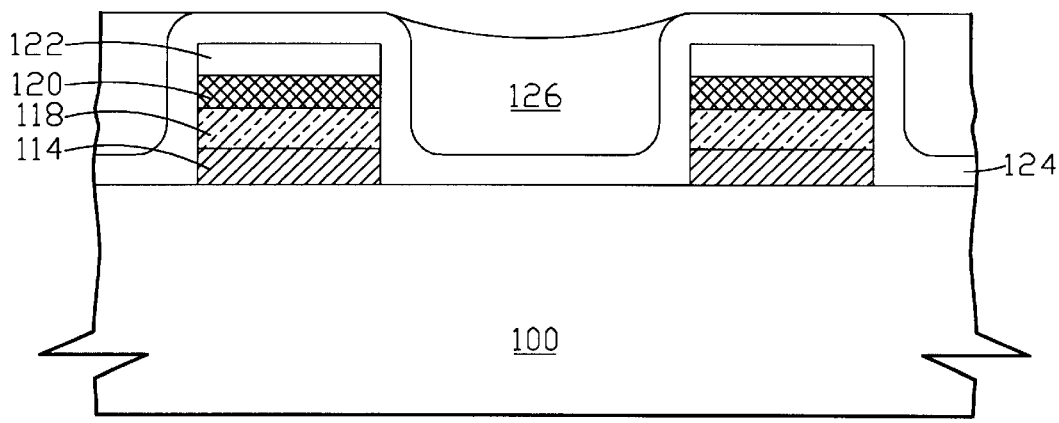
FIG. 4 shows the cross-sectional view along 4A–4A' in FIG. 1.

Referring to FIG. 1, a top view of non-volatile memories of this invention is shown. Buried diffusion lines 112, word lines 132, contact windows 134 and spacer 126 are shown. It is noted that only part of spacer 126 is shown for simplicity. The method for forming the non-volatile memories with self-aligned contacts will be described as the following. FIGS. 2A–2D are the process flow of this invention along 2A–2A' in FIG. 1. FIGS. 3A–3C show the process flow of this invention along 3A–3A' in FIG. 1. FIG. 4 is the cross-sectional view along 4A–4A' in FIG. 1.

Figure 2A:
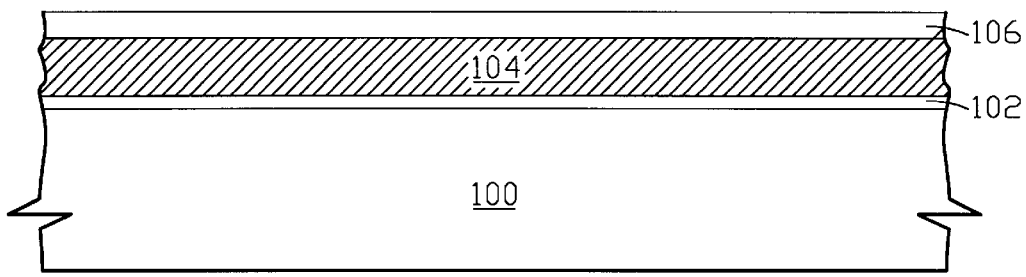
FIG. 2A shows a substrate having an oxide layer thereon, a conductive layer on the oxide layer and a dielectric layer on the conductive layer.

Referring to FIG. 2A, a substrate 100 having an oxide layer 102 thereon, a conductive layer 104 on the oxide layer 102 and a dielectric layer 106 on the conductive layer 104 is shown. The substrate 100 preferably comprises, but is not limited to: a silicon substrate with a <100> crystalline orientation. The oxide layer 102 can be formed by conventional wet or dry oxidation methods. The conductive layer 104 preferably comprises, but is not limited to: a polysilicon layer formed by conventional chemical vapor deposition methods such as a low pressure chemical vapor deposition (LPCVD) process that uses silane ($SiH_4$) as the major precursor. The thickness of the conductive layer 104 is preferably about 1500 angstrom. The dielectric layer 106 preferably comprises, but is not limited to: a silicon nitride layer formed by conventional chemical vapor deposition methods such as a low pressure chemical vapor deposition( LPCVD )process that uses dichlorosilane ($SiH_2Cl_2$) and $NH_3$ or silane ($SiH_4$) and $NH_4$ as the major precursors.

Figure 2B:
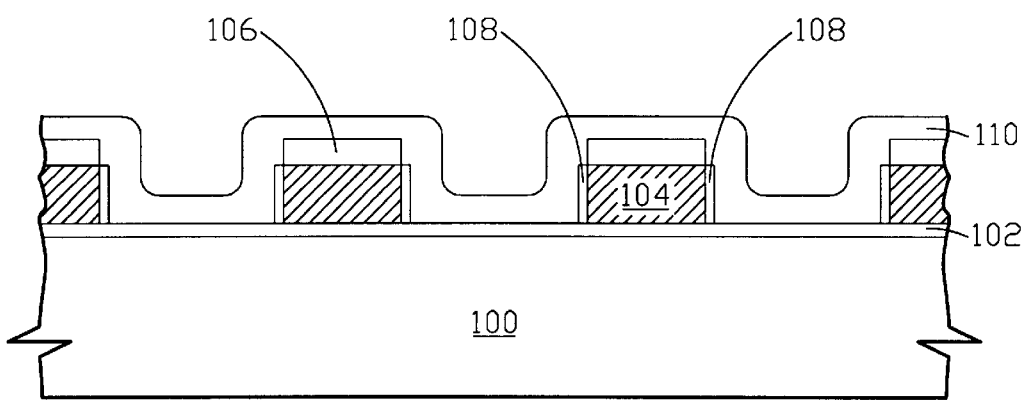
FIG. 2B shows a result of transferring a pattern of buried diffusion lines into the dielectric layer and the conductive layer to expose the oxide layer and forming oxide layers by oxidizing the sidewall of the conductive layer.

Referring to FIG. 2B, a pattern of buried diffusion region is transferred into the dielectric layer 106 and the conductive layer 104 to expose the oxide layer 102 by using conventional photolithography and etching processes, and oxide layers 108 are formed by oxidizing the sidewall of the conductive layer 104 via conventional wet or dry oxidation methods. The etching processes preferably comprise dry etching processes. A dielectric layer 110 comprising a HTO (High Temperature Oxide) layer is conformally formed over the structure by conventional methods.

Figure 2C:
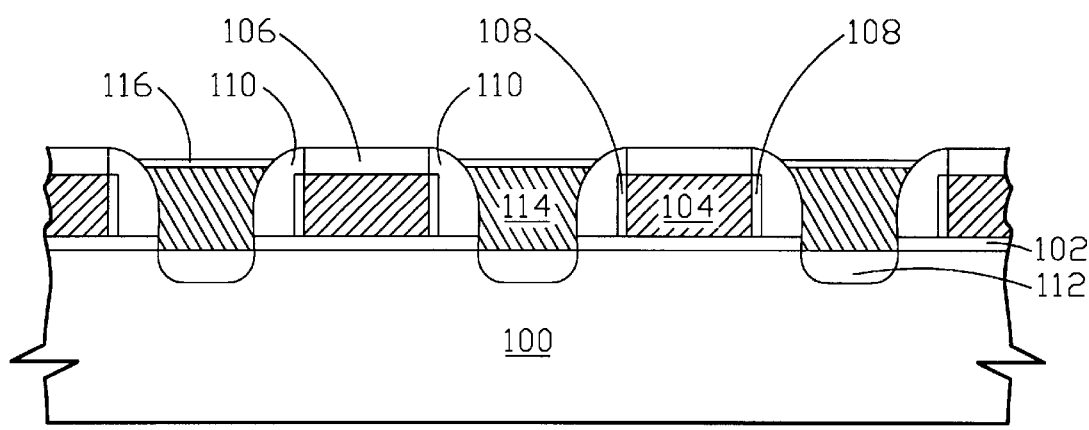
FIG. 2C shows a result of etching back the dielectric layer to form spacers and expose the substrate.

Referring to FIG. 2C, the dielectric layer 110 is etched back to form spacers and expose the substrate 100 by using conventional dry etching processes. Then buried diffusion lines 112 are formed in the substrate 100 by ion implantation processes. Next a conductive layer 114 is formed over the structure and is then etched back to a level lower than the top of the spacers by using conventional etching processes. The conductive layer 114 preferably comprises, but is not limited to: a polysilicon layer formed by conventional chemical vapor deposition methods such as a low pressure chemical vapor deposition (LPCVD) process that uses silane ($SiH_4$) as the major precursor. An oxide layer 116 is formed by oxidizing the top surface of the conductive layer 114 via conventional oxidation processes.

Figure 2D:
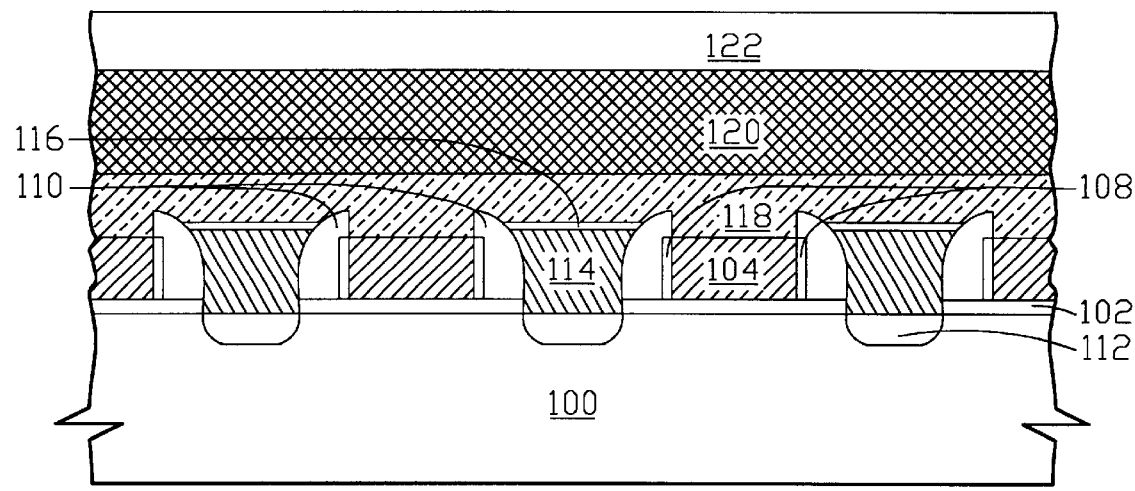
FIG. 2D shows a result of removing the dielectric layer, and sequentially forming a conductive layer, a conductive layer and a dielectric layer.

Referring to FIG. 2D, the dielectric layer 106 is removed by conventional etching processes. Then a conductive layer 118 is formed over the structure. The conductive layer 118 preferably comprises, but is not limited to: a polysilicon layer formed by conventional chemical vapor deposition methods such as a low pressure chemical vapor deposition (LPCVD) process that uses silane ($SiH_4$) as the major precursor. Next a conductive layer 120 comprising a tungsten silicide layer is formed over the conductive layer 118. The conductive layer 120 can be formed by conventional CVD processes such as low pressure chemical vapor deposition (LPCVD) processes that uses tungsten hexafluoride ($WF_6$) and silane ($SiH_4$) as precursors. A dielectric layer 122 is finally formed over the conductive layer 120. The dielectric layer 122 preferably comprises, but is not limited to: a silicon nitride layer formed by conventional chemical vapor deposition methods such as a low pressure chemical vapor deposition (LPCVD) process that uses dichlorosilane ($SiH_2Cl_2$) or silane ($SiH_4$) and $NH_4$ as the major precursors. The dielectric layer can 122 also be an oxide layer by conventional CVD processes.

FIGS. 3A–3C show the process flow of this invention along 3A–3A' in FIG. 1. Referring to FIG. 3A, the dielectric layer 122, the conductive layer 120 and the conductive layer 118 are etched by conventional photolithography and etching processes to expose the oxide layer 116 and form the word lines 132 shown in FIG. 1 which comprise the dielectric layer 122, the conductive layer 120 and the conductive layer 118 as shown in FIG. 3A. Then a dielectric layer 124 comprising a HTO layer is formed over the structure shown in FIG. 3A by conventional CVD processes. The dielectric layer 124 can also be a nitride layer formed by conventional CVD processes. Next a dielectric layer 126 is formed over the dielectric layer 124. The dielectric layer 126 preferably comprises, but is not limited to: a silicon nitride layer formed by conventional chemical vapor deposition methods such as a low pressure chemical vapor deposition( LPCVD )process that uses dichlorosilane ($SiH_2Cl_2$) or silane ($SiH_4$) and $NH_4$ as the major precursors. The dielectric layer 126 can also be an oxide layer formed by conventional CVD processes. The dielectric layer 124 is used as a liner and etching stop layer for the dielectric layer 126.

Referring to FIG. 3B, the dielectric layer 126 is etched back by using conventional dry etching processes to form spacer 126 adjacent the side walls of the word lines 132. An ILD (Inter-layer dielectric) layer 128 comprising a USG layer or a BPSG layer is next formed over the structure shown in FIG. 3B by conventional CVD processes such as atmosphere pressure chemical vapor deposition processes ( APCVD ) . Then a conventional RTP (Rapid Thermal Processing) process is performed to densify the ILD layer 128.

Referring to FIG. 3C, a contact hole 134 shown in FIG. 1 is formed into the ILD layer 128, the oxide layer 116 and the dielectric layer 124 to expose the conductive layer 114 by using conventional photolithography and dry etching processes. The spacer 126 can be used to prevent the misalignment of contact holes so that any process issues and device failures resulting from the etching of the contact holes can be avoided. A conductive material comprising aluminum is filled into the contact hole 134 to form a contact 130 by conventional physical vapor deposition (PVD) processes. FIG. 4 is the cross-sectional view along 4A–4A' in FIG. 1.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for forming a non-volatile memory, said method comprising:

providing a substrate having a first dielectric layer thereon, a first conductive layer on said first dielectric layer and a second dielectric layer on said first conductive layer;

transferring a pattern of buried diffusion regions into said second dielectric layer and said first conductive layer to expose said first dielectric layer and form a plurality of conductive lines;

forming a third dielectric layer over said substrate;

etching back said third dielectric layer to expose said substrate and said second dielectric layer and form spacers adjacent the side walls of said conductive lines;

performing an ion implantation process on said substrate to form the buried diffusion regions in said substrate;

forming a second conductive layer over said substrate;

etching back said second conductive layer to a level lower than the top of said spacers;

oxidizing the top surface of said second conductive layer to form an oxide layer;

removing said second dielectric layer;

forming a third conductive layer over said substrate;

forming a fourth conductive layer over said third conductive layer;

forming a fourth dielectric layer over said fourth conductive layer;

transferring a word line pattern comprising a plurality of word lines substantially perpendicular to said conductive lines into said fourth dielectric layer, said fourth conductive layer and said third conductive layer to expose said oxide layer;

forming a fifth dielectric layer over said substrate;

forming a sixth dielectric layer over said fifth dielectric layer;

etching back said sixth dielectric layer to expose said fifth dielectric layer;

forming a seventh dielectric layer over said substrate; and forming contact holes into said seventh dielectric layer and said oxide layer to expose said conductive lines.

2. The method according to claim 1, wherein said first dielectric layer comprises a silicon dioxide layer.

3. The method according to claim 1, wherein said first conductive layer comprises a polysilicon layer.

4. The method according to claim 1, wherein the thickness of said first conductive layer is preferably about 1500 angstrom.

5. The method according to claim 1, wherein said second dielectric layer comprises a silicon nitride layer.

6. The method according to claim 1, wherein said third dielectric layer comprises a high temperature oxide layer.

7. The method according to claim 1, wherein said second conductive layer and said third conductive layer comprise polysilicon layers.

8. The method according to claim 1, wherein said fourth conductive layer comprises a tungsten silicide layer.

9. The method according to claim 1, wherein said fourth dielectric layer comprises a silicon nitride layer.

10. The method according to claim 1, wherein said fifth dielectric layer comprises a high temperature oxide layer.

11. The method according to claim 1, wherein said sixth dielectric layer comprises a silicon nitride layer.

12. A method for forming a non-volatile memory, said method comprising:

providing a silicon substrate having a silicon dioxide layer thereon, a first polysilicon layer on said silicon dioxide layer and a first silicon nitride layer on said first polysilicon layer;

transferring a pattern of buried diffusion regions into said first silicon nitride layer and said first polysilicon layer to expose said silicon dioxide layer and form a plurality of conductive lines;

forming a high temperature oxide layer over said silicon substrate;

etching back said high temperature oxide layer to expose said silicon substrate and said first silicon nitride layer and form spacers adjacent the side walls of said conductive lines;

performing an ion implantation process on said silicon substrate to form the buried diffusion regions in said silicon substrate;

forming a second polysilicon layer over said silicon substrate;

etching back said second polysilicon layer to a level lower than the top of said spacers;

oxidizing the top surface of said second polysilicon layer to form an oxide layer;

removing said first silicon nitride layer;

forming a third polysilicon layer over said silicon substrate;

forming a tungsten silicide layer over said third polysilicon layer;

forming a second silicon nitride layer over said tungsten silicide layer;

transferring a word line pattern comprising a plurality of word lines substantially perpendicular to said conductive lines into said second silicon nitride layer, said tungsten silicide layer and said third polysilicon layer to expose said oxide layer;

forming a first dielectric layer over said silicon substrate;

forming a second dielectric layer over said first dielectric layer;

etching back said second dielectric layer to expose said first dielectric layer;

forming a inter-layer dielectric layer over said silicon substrate; and forming contact holes into said inter-layer dielectric layer and said oxide layer to expose said conductive lines.

13. The method according to claim 12, wherein the thickness of said first polysilicon layer is preferably about 1500 angstrom.

14. The method according to claim 12, wherein said first dielectric layer comprises a high temperature oxide layer.

15. The method according to claim 12, wherein said second dielectric layer comprises a silicon nitride layer.

16. The method according to claim 12, wherein said second dielectric layer is etched back by a dry etching process.

17. A method for forming a non-volatile memory, said method comprising:

providing a substrate having a first dielectric layer thereon, a first conductive layer on said first dielectric layer and a second dielectric layer on said first conductive layer;

transferring a pattern of buried diffusion regions into said second dielectric layer and said first conductive layer to expose said first dielectric layer and form a plurality of conductive lines;

forming a third dielectric layer over said substrate;

etching back said third dielectric layer to expose said substrate and said second dielectric layer and form spacers adjacent the side walls of said conductive lines by a dry etching process;

performing an ion implantation process on said substrate to form the buried diffusion regions in said substrate;

forming a second conductive layer over said substrate;

etching back said second conductive layer to a level lower than the top of said spacers;

oxidizing the top surface of said second conductive layer to form an oxide layer;

removing said second dielectric layer;

forming a third conductive layer over said substrate;

forming a fourth conductive layer over said third conductive layer;

forming a fourth dielectric layer over said fourth conductive layer;

transferring a word line pattern comprising a plurality of word lines substantially perpendicular to said conductive lines into said fourth dielectric layer, said fourth conductive layer and said third conductive layer to expose said oxide layer;

forming a fifth dielectric layer over said substrate;

forming a sixth dielectric layer over said fifth dielectric layer;

etching back said sixth dielectric layer to expose said fifth dielectric layer by using a dry etching process;

forming an inter-layer dielectric layer over said substrate; and forming contact holes into said inter-layer dielectric layer and said oxide layer to expose said conductive lines by using a dry etching process.

18. The method according to claim 17, wherein said fourth dielectric layer comprises an oxide layer.

19. The method according to claim 17, wherein said fifth dielectric layer comprises a nitride layer.

20. The method according to claim 17, wherein said sixth dielectric layer comprises an oxide layer.

* * * * *